United States Patent [19]
Capacci et al.

[11] Patent Number: 5,592,055
[45] Date of Patent: Jan. 7, 1997

[54] RADIO-FREQUENCY PLASMA SOURCE

[75] Inventors: Marco Capacci, Signa; Giovanni E. Noci, Bagno a Rippoli, both of Italy

[73] Assignee: Proel Tecnologie S.p.A., Florence, Italy

[21] Appl. No.: 544,018

[22] Filed: Oct. 17, 1995

[30] Foreign Application Priority Data

Oct. 21, 1994 [IT] Italy ................... FI94A0194

[51] Int. Cl.⁶ ................................................. H01J 7/24
[52] U.S. Cl. ................... 315/111.21; 315/111.41; 315/111.31; 315/111.81; 313/231.31; 313/234
[58] Field of Search .................... 315/111.21, 111.31, 315/111.41, 111.51, 111.71, 111.81; 313/231.31, 362.1, 234

[56] References Cited

U.S. PATENT DOCUMENTS

| | | | |
|---|---|---|---|
| 4,713,585 | 12/1987 | Ohno et al. ................... | 315/111.81 |
| 4,857,809 | 8/1989 | Torii et al. ................... | 315/111.31 |
| 4,870,245 | 9/1989 | Price et al. ................... | 219/121.36 |
| 5,036,252 | 7/1991 | Löb ................... | 315/111.31 |
| 5,077,499 | 12/1991 | Oku ................... | 315/111.21 |
| 5,081,398 | 1/1992 | Asmussen et al. ................... | 315/111.41 |
| 5,107,170 | 4/1992 | Ishikawa et al. ................... | 315/111.21 X |
| 5,241,243 | 8/1993 | Cirri ................... | 315/111.21 |
| 5,241,244 | 8/1993 | Cirri ................... | 315/111.41 |

FOREIGN PATENT DOCUMENTS 1289251  11/1989  Japan.

*Primary Examiner*—Robert Pascal
*Assistant Examiner*—Haissa Philogene
*Attorney, Agent, or Firm*—McGlew and Tuttle, P.C.

[57] ABSTRACT

A plasma source is described, comprising a discharge chamber (1) bounded by a base wall (5) and by a lateral wall (3), a system (7) for the admission of gas into said discharge chamber, a system of electrodes (13, 15) which are associated with said discharge chamber (1) and which are connected to a radio-frequency generator (17), and which apply an oscillating electric field within the discharge chamber, and means (9, 11) for generating a static magnetic field in said discharge chamber. Coaxially with said discharge chamber (1) there are disposed a first and a second electrode (15; 13; 13X), at least one of which has an annular extent and is disposed in an intermediate position along the axial extent of the discharge chamber, said two electrodes (15; 13; 13X) being connected to two poles of the radio-frequency generator.

8 Claims, 4 Drawing Sheets

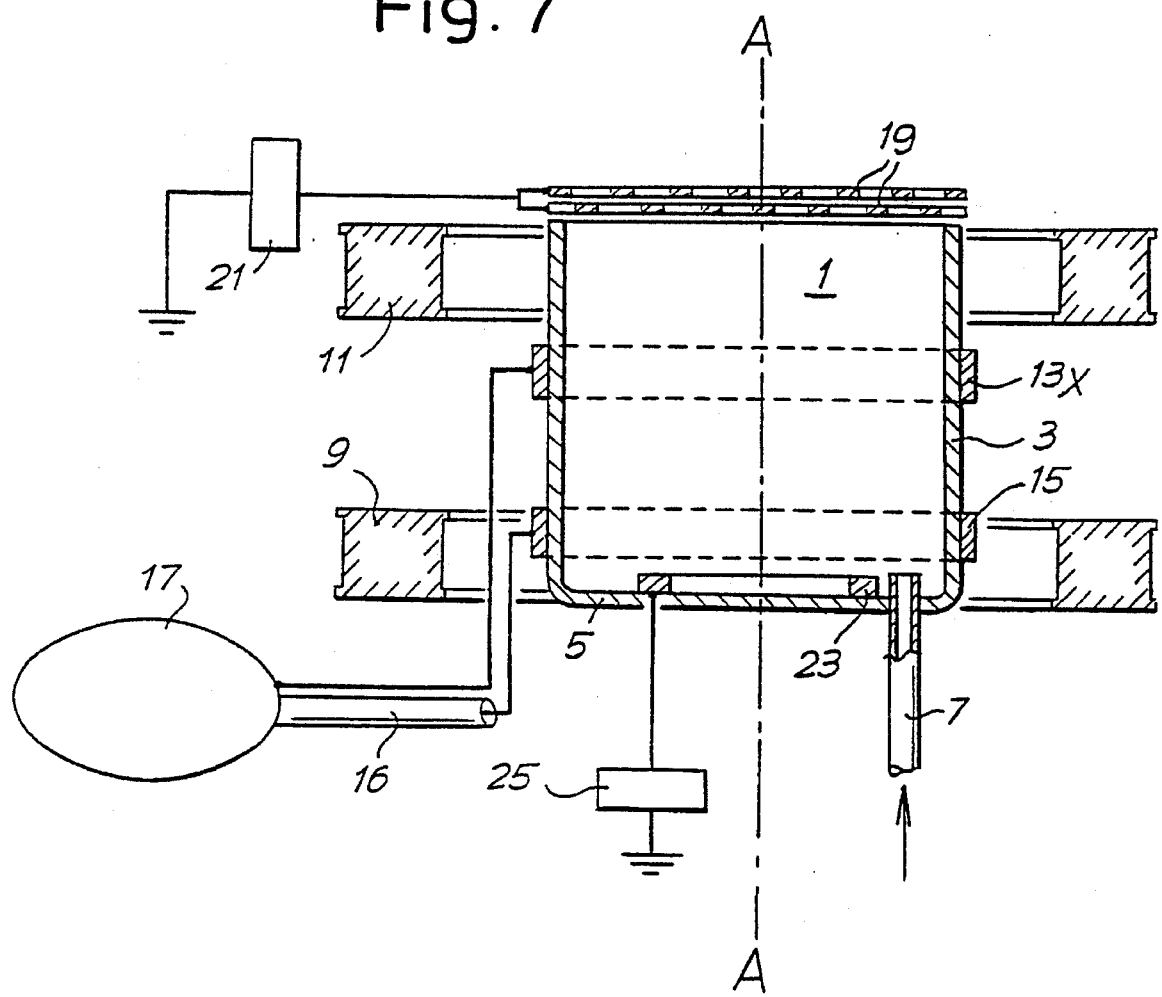

RADIO-FREQUENCY PLASMA SOURCE

TECHNICAL FIELD

The invention relates to a plasma source comprising a discharge chamber bounded by a base wall and by a lateral wall, a system for the admission of gas into said discharge chamber, a system of electrodes which are associated with said discharge chamber and which are connected to a radio-frequency generator and which apply an oscillating electric field within the discharge chamber, and means for generating a static magnetic field in said discharge chamber.

The invention further relates to an ion-beam generator incorporating a plasma source of this type.

Finally, the invention relates to a method for the generation of plasma in a discharge chamber, into which a gas is admitted and in which a static magnetic field and a radio-frequency oscillating electric field are generated.

These systems are used in the industrial field, for example for ion etching plants, for working processes in the production of microelectronic devices etc. In these applications, it is advantageous to have available particularly efficient plasma sources in order to reduce the processing costs.

Similar systems are used in the space field, for the construction of ion engines or other devices incorporating a plasma source. In these applications, it is necessary to produce intense ion beams with low consumption of propellent gas and of electric power, as it is necessary both to minimize the weight of the devices mounted on satellites and to obtain the maximum life of the engine, which life is determined by the quantity of propellent gas carried and by the consumption.

PRIOR ART

Currently, the most well known systems for the generation of plasma may be classified as follows:

1) Plasma sources based on the continuous emission of electrons emitted by a possibly heated cathode, which are accelerated and reach an anode. During their acceleration, the electrons ionize the gas molecules, generating the plasma. These sources base their efficiency on the possibility of accelerating in a continuous and direct manner a large number of electrons emitted from the cathode, by virtue of the DC electric field which is generated between cathode and anode. Sources of this type are described, by way of example, in U.S. Pat. No. 5,241,243, U.S. Pat. No. 5,075,594, U.S. Pat. No. 4,749,912 and U.S. Pat. No. 4,714,831;

2) plasma sources based on radio-frequency (RF) discharges. In these sources, the energy is transferred to the electrons in an efficient manner by virtue of an appropriate selection of the pressure in the discharge chamber. Sometimes, a static magnetic field is superposed for the purpose of improving the confinement of the plasma within the discharge chamber and thus limiting the losses of ions and electrons on the walls. Indeed, as is known to persons skilled in the art, when an electron and an ion impinge together on a wall, they have a high probability of recombining, giving rise to a neutral molecule (see U.S. Pat. No. 5,036,252);

3) microwave sources which utilize the static magnetic field for the purpose of generating an Electron Cyclotron Resonance (ECR) effect. These are sources which utilize a combination of the radio-frequency electric field with a suitable value of the static magnetic field. Sources of this type are described, by way of example, in U.S. Pat. No. 5,241,244, U.S. Pat. No. 4,739,169 and U.S. Pat. No. 4,438,368.

The object of the present invention is to provide a plasma source which permits the generation of plasma in a particularly efficient manner, with advantages in terms of saving of gas and of power as compared with the known sources. These advantages are particularly important in the space field, where it is necessary to reduce to the minimum the consumption both of propellent gas and of power.

DESCRIPTION OF THE INVENTION

These and other objects, which will be clear to persons skilled in the art upon reading the text which follows, are obtained with a device in which, coaxially with said discharge chamber, there are disposed a first and a second electrode, at least one of which has an annular extent and is disposed in an intermediate position along the axial extent of the discharge chamber, said two electrodes being connected to two poles of the radio-frequency generator; and in which the means for generating the static magnetic field generate a magnetic field $B_0$ approximately parallel to the axis of the discharge chamber with an average intensity in the discharge chamber for which the corresponding electron cyclotron frequency fc satisfies the condition $$f < fc < 7f \qquad (1)$$

preferably $$f < fc < 3f$$

where f is the frequency of the electric field. The cyclotron frequency $f_c$ is linked to the magnetic field $B_0$ by the relation $$fc = \frac{eB_0}{2\pi m_e} \qquad (2)$$

where e is the electric charge of the electron ($1.602 \cdot 10^{-19}$ C.) and $m_e$ is the mass of the electron ($9.1 \cdot 10^{-31}$ kg). On stating the condition (1) with respect to the magnetic field $B_0$, the result is:

$$\frac{2\pi m_e f}{e} < B_0 < \frac{14\pi m_e f}{e} \qquad (3)$$

According to a possible embodiment, both the electrodes are annular and are disposed coaxially with the discharge chamber in two different positions.

Preferably, however, the first electrode is of discoid shape and applied in correspondence with the base of the discharge chamber, internally and externally of the latter.

The invention is based on the recognition of the fact that the synergic and contemporaneous utilization of an appropriate configuration of the electrodes, which generate a suitable electric field in the discharge chamber and the provision of a suitable profile of the static magnetic field, specifies a condition which is extremely favorable for generating the plasma. What is obtained, then, is a significant increase in the plasma density with the same conditions of gas pressure in the discharge chamber (and thus of consumption of propellent) and of radio-frequency power supplied to the electrodes.

Further advantageous features of the plasma source according to the invention and of the pertinent method of generation of plasma are indicated in the appended claims. In particular, the static magnetic field may be generated by one or more electromagnets, by one or more coils or by an annular arrangement of permanent magnets, or by a combination of said means, which surround the discharge chamber coaxially with the latter, at least in proximity to the base wall. It is also possible to utilize two exciter coils, one in proximity to the base and one in proximity to the aperture of the discharge chamber.

By arranging a system of extraction grids with associated means for polarizing said grids, in front of the mouth of the discharge chamber, and an electrode within the discharge chamber (with associated polarizing means), the plasma source may be utilized for the generation of an ion beam and thus in the capacity of an ion engine for the generation of thrust on satellites.

It has been experimentally verified that the utilization of the electrodes in the above indicated configuration and the selection of the profile of the magnetic field $B_0$ permit the plasma density to be increased by a factor even exceeding five with the same flux of the static magnetic field and radio-frequency power as compared with what is obtained under different magnetic field conditions.

The experimental trials were carried out with a frequency f=100 MHz. Nevertheless, the selection of the value of the frequency of the oscillating magnetic field is not limited to this value.

It is known to persons skilled in the art that there are suitable combinations of frequency f of electric field and magnetic field intensity $B_0$ such as to make possible the penetration of the radio-frequency electric field Erf into the plasma by means of the propagation of waves in said plasma.

It is known from theory that in the absence of a magnetic field there can propagate only longitudinal (electrostatic) waves at frequency f≈fpi, fpe and transverse waves with f≈fpe, where fpi (plasma ion frequency) and fpe (plasma electron frequency) are defined by $$fpe = \frac{1}{2\pi} \sqrt{\left(\frac{e^2}{me\epsilon_0} N_e\right)} \quad (4)$$

$$fpi = \frac{1}{2\pi} \sqrt{\left(\frac{e^2}{mi\epsilon_0} N_e\right)}$$

where $\epsilon_0$ is the dielectric constant in vacuum, $N_e$ is the plasma density, $m_i$ and $m_e$ are, respectively, the mass of the ions and of the electrons. Typically, for plasmas generated by discharges in gases at low pressures ($\leq 10^{-3}$ mbar) in which the plasma density is within the range between $10^{10}$ and $10^{12}$ cm$^{-3}$, the result is fpe≧1 GHz and fpi<20 MHz.

The presence of a static magnetic field of suitable profile and of suitable intensity such as to satisfy the condition (1) set out hereinabove, permits the propagation of both electromagnetic and electrostatic waves in the plasma, even with frequencies f different from fpi and fpe. Furthermore, as is known to persons skilled in the art, the dispersion curves of the electromagnetic fields in the plasma and the profiles of the electromagnetic fields of the transverse and longitudinal modes in which there is assumed a value of f such as to satisfy (1) prove to be substantially independent of other parameters, at least as long as fpi<f<fpe.

From this last mentioned consideration, it is possible to extend the experimental results obtained at f=100 MHz also to values of frequency of the oscillating electric field which are different, for example but not exclusively within the entire VHF band (30–300 MHz), since for this frequency band and for the plasma densities which are normally used in these devices it is possible easily to satisfy the condition fpi<f<fpe.

The possibility of triggering one or more electromagnetic waves within the plasma facilitates the penetration of the electric field throughout the volume occupied by the plasma. Indeed, it is known that if waves are not excited the electric fields are confined to the vicinity of the walls of the discharge chamber and do not propagate within the entire volume, on account of the so called "skin effect" (screening of the electric field by the plasma). The "skin effect" limits the efficiency of the discharge as the electric field can supply energy to the electrons for ionization only in that region of the discharge chamber which is closest to the walls.

On the other hand, the possibility of triggering waves in the entire volume in which the plasma is confined permits the utilization of the entire volume of the discharge chamber for supplying energy to the electrons present in the plasma. Once these have reached a kinetic energy at least equal to the ionization energy of the gas, on impinging upon the neutral particles they give rise to new ion-electron pairs, bringing about the process of ionization of the propellant.

The condition of utilization of the entire discharge volume, which is obtainable with the combination of electrodes and of the profile of the magnetic field according to the present invention, is therefore that which permits the attainment of high ionization efficiencies, understood as the ratio between plasma density $N_e$ and neutral-particle density $N_0$.

The source according to the invention exhibits the following advantages:

a) as compared with heated cathode plasma sources, it does not utilize either cathodes or filaments which are hot. This eliminates the disadvantages deriving from the sensitivity of these elements to erosion due to the bombardment by the electrically charged particles. Furthermore, there is an improved simplicity of construction;

b) as compared with radio-frequency sources of known type, the configuration according to the present invention permits the attainment of an efficiency in the plasma production which is far greater, by virtue of successful excitation of a wave within the plasma, which permits the utilization of the entire volume of the plasma, rather than only the zone in proximity to the walls, for the purpose of supplying energy to the electrons. Consequently, the latter are able, more rapidly and in larger numbers, to acquire the energy necessary to ionize the neutral atoms of the gas and to bring about the ionization process.

BRIEF DESCRIPTION OF THE DRAWINGS

The invention will be better understood upon following the description and the accompanying drawing, which shows a possible nonlimiting embodiment of said invention. In particular:

FIG. 7 shows a modified embodiment.

DESCRIPTION OF THE PREFERRED EMBODIMENT

Figure 1:
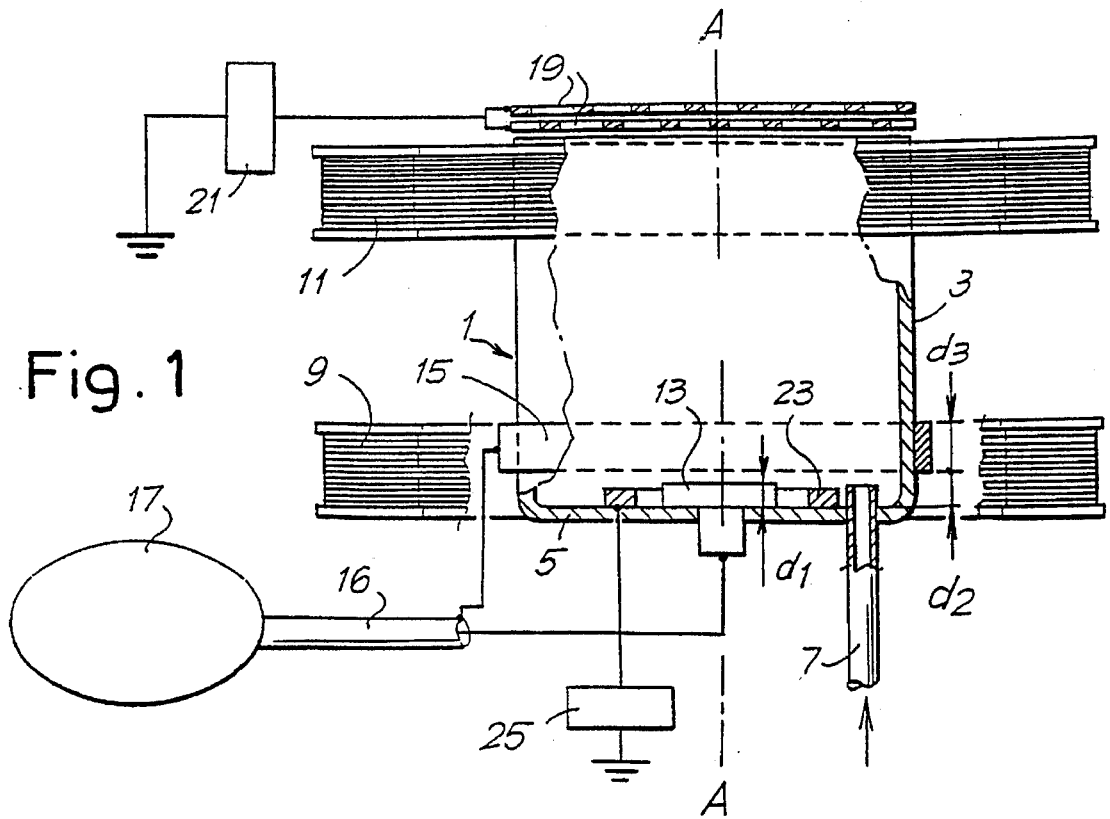
FIG. 1 shows a diagrammatic lateral view and partial cross-section of a plasma source according to the invention.

Referring to FIG. 1, by 1 there is generally indicated the discharge chamber, which is bounded by a lateral wall 3 and by a base wall 5. The discharge chamber 1 exhibits generally a cylindrical configuration with axis A—A. With the discharge chamber there is associated a duct for the admission of gas, which duct is diagrammatically indicated by 7, through which the propellent gas is fed in.

Around the cylindrical lateral wall 3, of glass, quartz or some other material which is preferably but not necessarily dielectric, defining the discharge chamber 1, there are disposed two annular coils 9 and 11, the first in correspondence with the base wall 5 and the second in correspondence with the front aperture or mouth of the discharge chamber. The coils 9 and 11 generate the static magnetic field $B_0$.

The wall of the chamber 1 could also be metallic.

In correspondence with the base wall 5 there is disposed a first electrode 13, for example in the form of a small disc, placed in axial fashion with the discharge chamber 1, that is to say with its own axis coincident with the axis A—A. In the example of FIG. 1, the electrode 13 is placed within the discharge chamber, that is to say in direct contact with the plasma.

By 15 there is indicated a second electrode, of annular form, which is placed (in the example of FIG. 1) outside the lateral wall 3 of the discharge chamber 1.

The two electrodes 13 and 15 are connected, for example by means of a coaxial cable 16, to a radio-frequency generator, of the type known to persons skilled in the art and diagrammatically indicated by 17.

In one (nonlimiting) possible configuration, the thickness $d_1$ of the first electrode 13 may be equal to 1 cm, and its diameter to 5 cm; the internal diameter of the annular second electrode is a function of the dimension of the chamber and may be equal to 10 cm and the axial dimension $d_3$ may be approximately 1 cm.

The distance $d_2$ between electrode 15 and base wall 5 may be within the range between 0 and 2.5 cm, preferably 1.5 cm.

By 19 there is generally indicated a system of extraction grids of the type known per se, which is polarized by means of a voltage generator 21. By 23 there is indicated an anode which is polarized, with sign opposite to the grids, by means of a generator 25.

Figure 2:
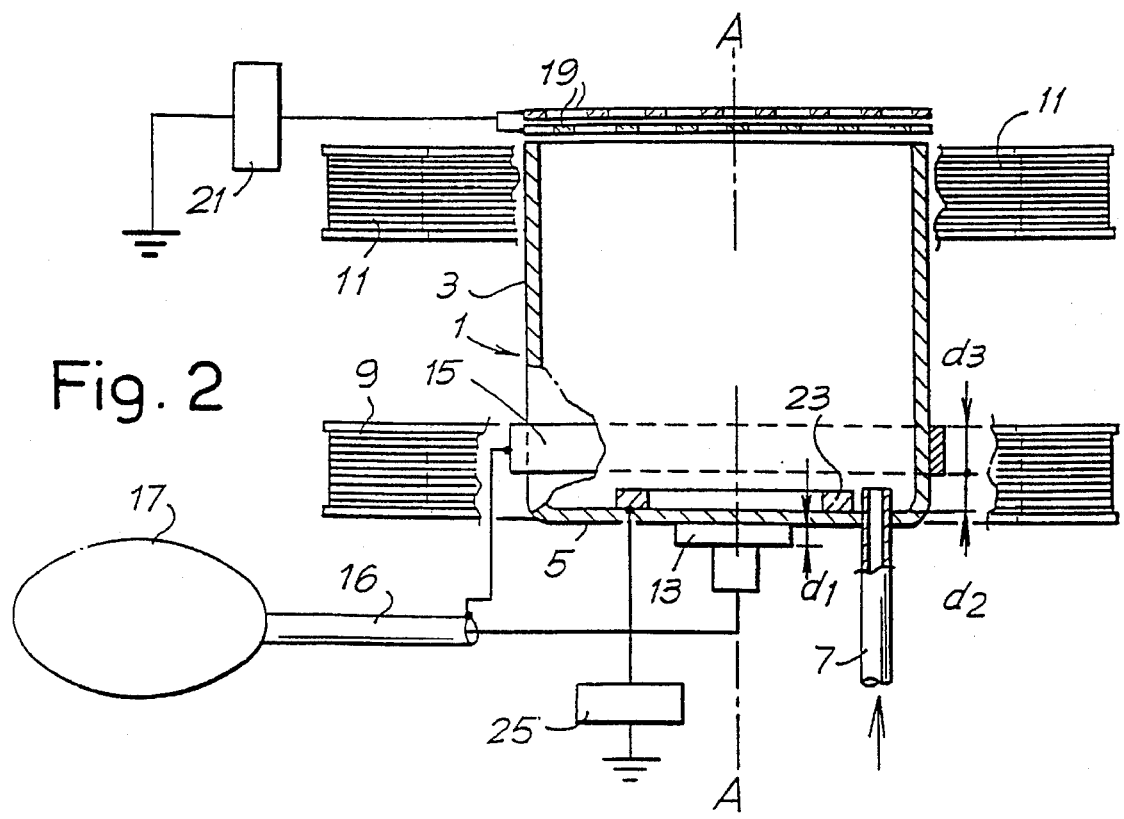
FIGS. 2 to 4 show alternative configurations of the electrodes.
Figure 3:
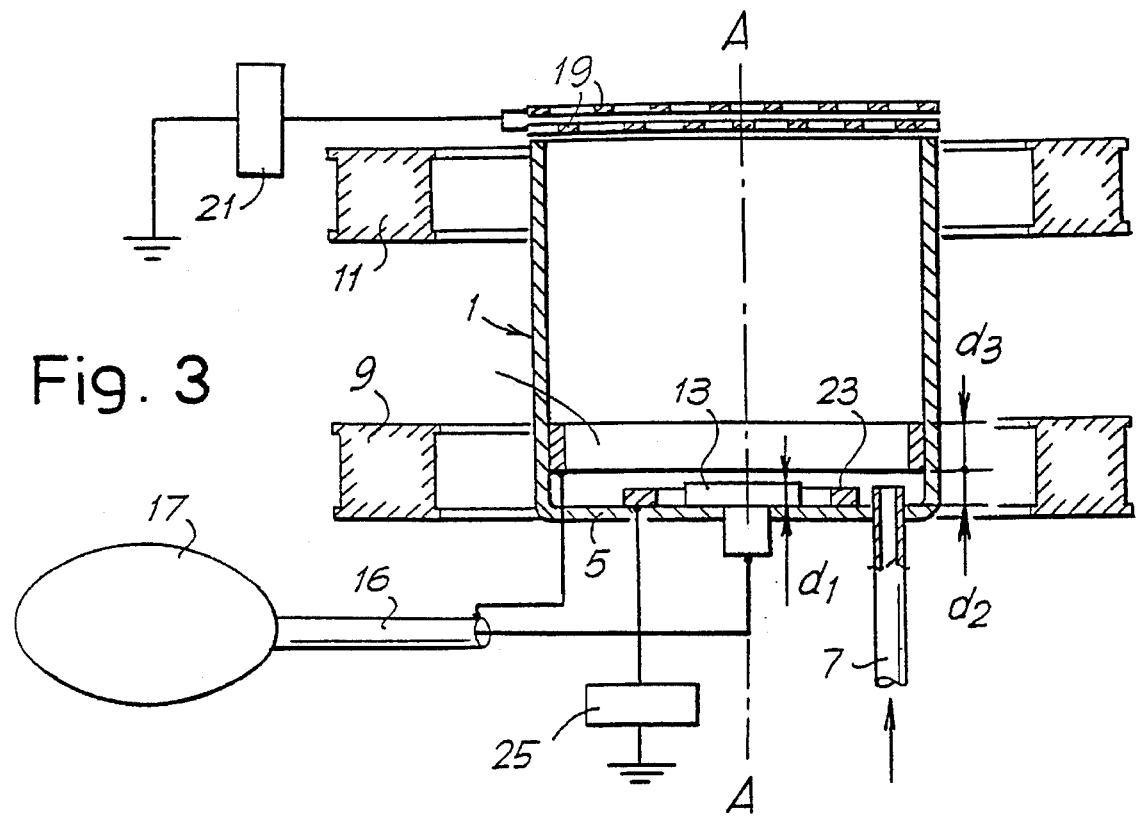
Figure 4:
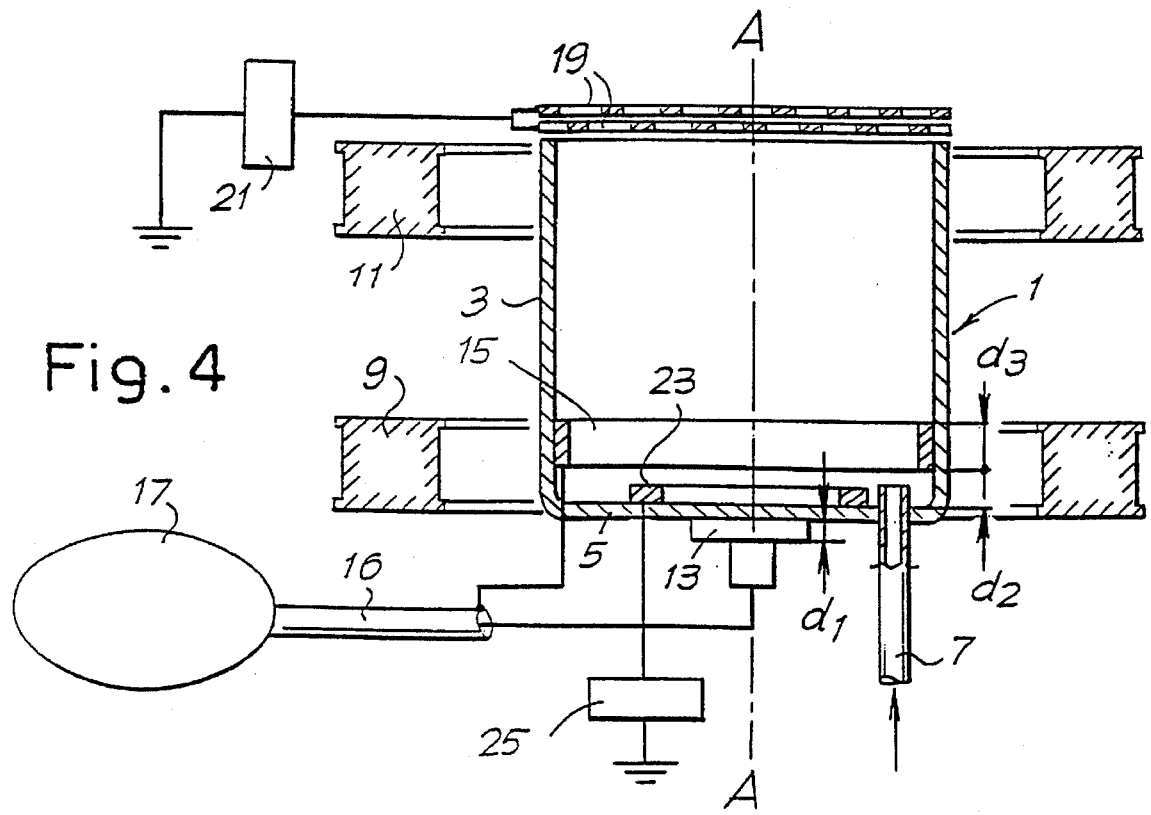

FIGS. 2 to 4, in which identical or corresponding parts are indicated by the same reference numerals, show variants of configuration. FIG. 2 shows a modified embodiment, in which the electrode 13 is also placed outside the discharge chamber 1. FIG. 3 shows an embodiment in which both of the electrodes 13 and 15 are disposed within the discharge chamber 1, and FIG. 4 shows a configuration in which the electrode 13 is placed outside the discharge chamber and the electrode 15 within said chamber.

Figure 5:
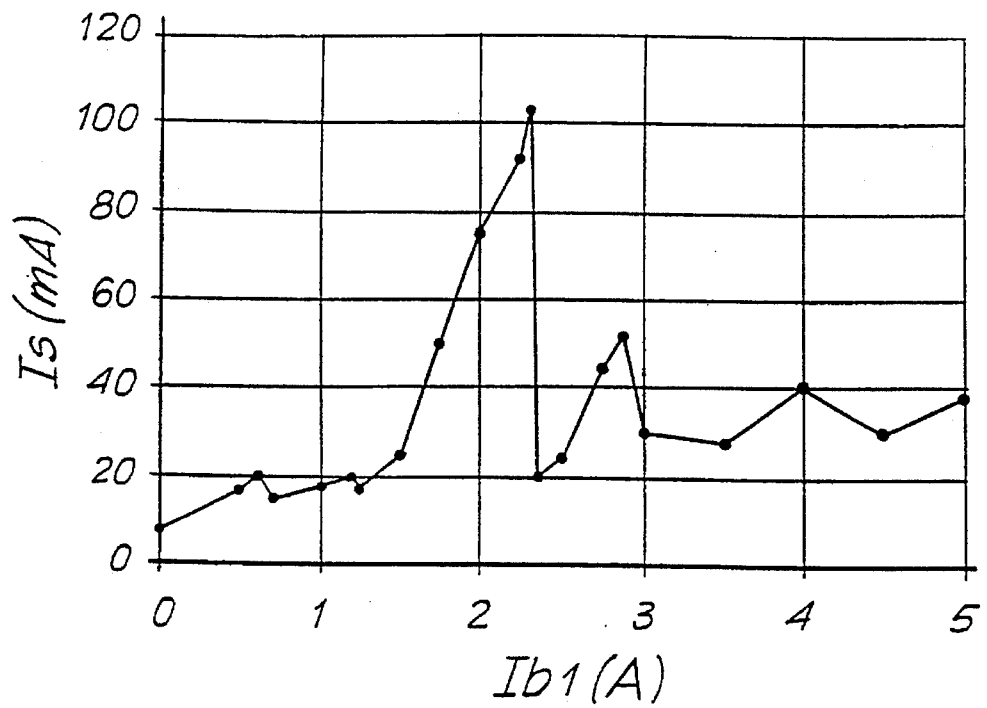
FIG. 5 shows an experimental diagram of the variation of the current extracted from the plasma source upon varying the static magnetic field.
Figure 6:
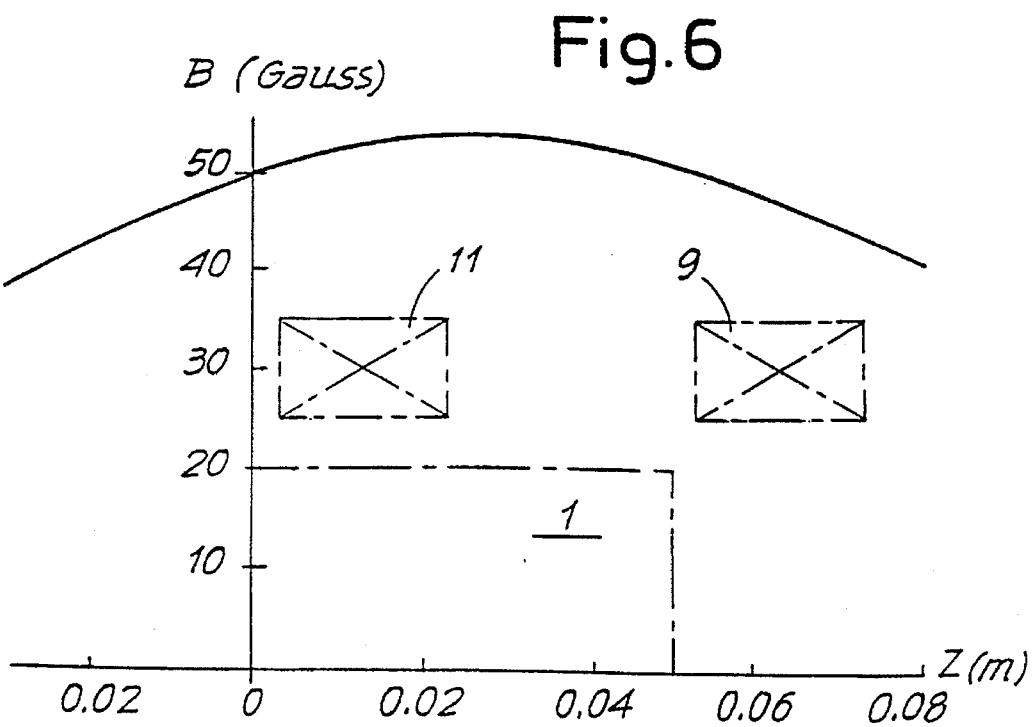
FIG. 6 shows the profile of the static magnetic field along the axial extent of the discharge chamber, in the optimal condition of FIG. 5.

FIGS. 5 and 6 show the experimental results obtained with an ion beam generator utilizing a plasma source constructed according to the invention. More specifically, FIG. 5 shows a diagram which shows as abscissa the current Ibl in the coil 11 (amperes) and as ordinate the current extracted from the plasma source equipped with the system of grids 19. The current in the coil 9 is assumed to be fixed and equal to 1.1 A. As is evident from the diagram, the current extracted from the plasma source exhibits an optimal value, which is characterized by a strong peak, in correspondence with a suitable value of the current Ibl, and therefore of the magnetic field $B_0$, maintaining constant the other operating parameters, which in the example are assumed to be the following:

flow of propellent gas (xenon): 1.7 sccm
radio-frequency power delivered by the generator 17: 50 W
frequency (f) of the electric field Erf: 100 MHz.

FIG. 6 shows the profile on the axis of the source of the magnetic field $B_0$ under the optimal conditions of FIG. 5. The abscissa shows the position along the axial extent of the discharge chamber, the profile of which is shown graphically. The ordinate shows the intensity $B_0$ of the magnetic field. The positions of the coils 9 and 11 are also indicated. For f=100 MHz, the result is $f<f_c<2f$, not uniform along the axis of the chamber.

FIG. 7 shows a modified embodiment, in which the electrode 13 is replaced by an electrode 13X of annular form and substantially similar to the electrode 15.

The electrode 13X is disposed along the axial extent of the discharge chamber 1, just like the electrode 15, the latter being located between the base 5 and the electrode 13X.

It is understood that the drawing shows only possible embodiments of the invention, which may itself vary in forms and configurations without departing from the inventive concept. By way of example, as previously mentioned, the coil 11 may be omitted. Furthermore, one or both of the coils 9 and 11 may be replaced by permanent magnets.

The possible presence of reference numerals in the appended claims does not limit the scope of the protection thereof.

We claim:

1. A plasma source comprising a discharge chamber (1) bounded by a base wall (5) and by a lateral wall (3), a system (7) for the admission of gas into said discharge chamber, a system of electrodes (13, 15) which are associated with said discharge chamber (1) and which are connected to a radio-frequency generator (17), and which apply an oscillating electric field within the discharge chamber and means (9, 11) for generating a static magnetic field in said discharge chamber, characterized in that:

coaxially with said discharge chamber (1) there are disposed a first and a second electrode (15; 13; 13X), at least one of which has an annular extent and is disposed in an intermediate position along the axial extent of the discharge chamber, said two electrodes (15; 13; 13X) being connected to two poles of the radio-frequency generator;

and in that the means (9, 11) for generating the static magnetic field generate a magnetic field ($B_0$) approximately parallel to the axis (A—A) of the discharge chamber, with an average intensity in the discharge chamber for which the corresponding electron cyclotron frequency $f_c$ satisfies the condition $f<fc<7f$ where f is the frequency of the electric field.

2. Plasma source according to claim 1, characterized in that both of said electrodes (13X, 15) have an annular extent and are disposed in two distinct intermediate positions along the axial extent of the discharge chamber (1).

3. Plasma source according to claim 1, characterized in that said first electrode (13) is applied in correspondence with the base wall (5) of the discharge chamber (1).

4. Plasma source according to claim 3, characterized in that said first electrode (13) has the shape of a small disc disposed on the base wall (5) of the discharge chamber (1).

5. Plasma source according to claim 3, characterized in that said second electrode (15) is disposed in an intermediate position along the axial extent of the discharge chamber (1), between the base wall (5) and half the height of the discharge chamber.

6. Plasma source according to claim 1, characterized in that it comprises a system of extraction grids (19) associated with a polarizing means (21) and a polarizing electrode (23) with associated polarizing means (25) for generating an ion beam.

7. Method for the generation of plasma in a discharge chamber (1) comprising a base wall (5) and a lateral wall (3), in which in said chamber there is generated a static magnetic field ($B_0$) and there is disposed a system of electrodes (13, 15) which apply a radio-frequency electric field (Erf) within the discharge chamber (1), characterized by:

disposing a first electrode (13) and a second electrode (15) coaxially with said chamber (1), at least one of said electrodes being of annular extent;

and by generating a static magnetic field ($B_0$) approximately parallel to the axis (A—A) of the discharge chamber, the magnetic field exhibiting an average intensity in the discharge chamber for which the corresponding electron cyclotron frequency $f_c$ satisfies the condition $f < f_c < 7f$ where f is the frequency of the electric field.

8. Method according to claim 7, characterized by disposing said first electrode (13) in proximity to the base wall (5) of the discharge chamber (1) and said second electrode in an intermediate position along the axial extent of the discharge chamber, said second electrode being of annular extent.

* * * * *